(12) United States Patent
Pecorini et al.

(10) Patent No.: US 7,147,927 B2
(45) Date of Patent: Dec. 12, 2006

(54) BIAXIALLY ORIENTED POLYESTER FILM AND LAMINATES THEREOF WITH COPPER

(75) Inventors: Thomas Joseph Pecorini, Kingsport, TN (US); Gary Darrel Boone, Johnson City, TN (US)

(73) Assignee: Eastman Chemical Company, Kingsport, TN (US)

( * ) Notice: Subject to any disclaimer, the term of this patent is extended or adjusted under 35 U.S.C. 154(b) by 267 days.

(21) Appl. No.: 10/606,070

(22) Filed: Jun. 25, 2003

(65) Prior Publication Data

US 2004/0265608 A1    Dec. 30, 2004

Related U.S. Application Data

(60) Provisional application No. 60/391,172, filed on Jun. 26, 2002.

(51) Int. Cl.
| | |
|---|---|
| B32B 15/08 | (2006.01) |
| B32B 15/09 | (2006.01) |
| B32B 15/20 | (2006.01) |
| B32B 27/36 | (2006.01) |
| B32B 38/00 | (2006.01) |

(52) U.S. Cl. ............... 428/458; 428/457; 428/480; 428/910; 528/302; 528/305; 528/307; 528/308; 528/308.6; 528/308.7; 264/288.4; 264/290.2

(58) Field of Classification Search ............... None
See application file for complete search history.

(56) References Cited

U.S. PATENT DOCUMENTS

| | | |
|---|---|---|
| 2,901,466 A | 8/1959 | Kibler et al. |
| 3,284,223 A | 11/1966 | Watson et al. |
| T876,001 I4 | 7/1970 | Bell et al. |
| 3,896,076 A * | 7/1975 | Watanabe et al. ........ 523/440 |
| 3,907,754 A | 9/1975 | Tershansy et al. |
| 3,962,189 A | 6/1976 | Russin et al. |
| 4,010,145 A | 3/1977 | Russin et al. |
| 4,356,299 A | 10/1982 | Cholod et al. |
| 4,557,982 A | 12/1985 | Nouda et al. |

(Continued)

FOREIGN PATENT DOCUMENTS

EP    1207035 A1    5/2002

(Continued)

*Primary Examiner*—Vivian Chen
(74) *Attorney, Agent, or Firm*—B. J. Boshears; Bernard J. Graves, Jr.

(57) ABSTRACT

Disclosed are biaxially oriented polyester film produced from a polyester comprising:
(1) diacid residues comprising at least 90 mole percent of terephthalic acid residues, naphthalenedicarboylic acid residues or combinations thereof; and
(2) diol residues comprising at least 90 mole percent of 1,4-cyclohexanedimethanol residues; wherein the polyester comprises a total of 100 mole percent diacid residues and a total of 100 mole percent diol residues;
wherein the polyester film is stretched at a ratio of about 2.5× to 3× in the machine direction (MD) and about 2.5× to 3× in the transverse direction (TD) at stretching temperatures between 90 and 110OC, wherein the stretched film is subsequently heat-set at an actual film temperature of from 260° C. to Tm, wherein Tm is the melting point of the polyester as measured by differential scanning calorimetry (DSC), while maintaining the dimensions of the stretched film, and wherein the biaxially oriented and heat-set polyester film undergoes not more than 3% shrinkage when immersed for 10 seconds in a solder bath preheated to 260° C. and exhibits a coefficient of thermal expansion value of 10–85 ppm/° C. when measured between 120 and 150° C., and a coefficient of thermal expansion value of 10–42 ppm/° C. when measured between 25 and 90° C.

10 Claims, 3 Drawing Sheets

U.S. PATENT DOCUMENTS

| | | | |
|---|---|---|---|
| 5,017,680 A | 5/1991 | Sublett | |
| 5,153,302 A * | 10/1992 | Masuda et al. | 528/272 |
| 5,668,243 A | 9/1997 | Yau et al. | |
| 5,681,918 A | 10/1997 | Adams et al. | |
| 2002/0058133 A1 | 5/2002 | Mueller et al. | |

FOREIGN PATENT DOCUMENTS

| | | |
|---|---|---|
| GB | 1117904 A | 6/1968 |
| JP | 58 214208 A | 12/1983 |
| JP | 60 069133 A | 4/1985 |
| JP | 91 000215 B2 | 4/1985 |
| JP | 60 085437 A | 5/1985 |
| JP | 90 063256 B2 | 5/1985 |
| JP | 01 299019 A | 12/1989 |
| JP | 2-164532 | 6/1990 |
| JP | 2-187331 | 7/1990 |
| JP | 2 196833 A | 8/1990 |
| JP | 02 301419 | 12/1990 |
| JP | 3 241518 A | 10/1991 |
| JP | 04 214757 A | 8/1992 |
| JP | 2 679174 B | 11/1997 |
| WO | WO 92/14771 A1 | 9/1992 |
| WO | WO 96/06125 A1 | 2/1996 |

* cited by examiner

BIAXIALLY ORIENTED POLYESTER FILM AND LAMINATES THEREOF WITH COPPER

CROSS-REFERENCE TO RELATED APPLICATION

This application claims the benefit of Provisional Patent Application No. 60/391,172 filed Jun. 26, 2002.

FIELD OF THE INVENTION

This invention pertains to novel thermally-stable polyester film and to polyester laminates as well as copper-polyester laminates utilizing the thermally-stable polyester film. Preferably, these films possess a desirable combination of heat resistance (solder & dimensional stability) and low coefficient of thermal expansion required for use for flexible circuit applications. More specifically, this invention pertains to thermally-stable polyester film produced from poly (1,4-cyclohexylenedimethylene terephthalate) or poly(1,4-cyclohexylenedimethylene naphthalenedicarboxylate) homo- or copolyester or blends thereof, biaxially oriented or stretched, and heat-set under certain conditions.

BACKGROUND OF THE INVENTION

Poly(ethylene terephthalate) (PET) films are widely used for a variety of wrapping, packaging and lamination applications. PET film sometimes is used in shrink wrap applications in which the film is applied to an object and heated so that the film shrinks around the object. In other applications such as flexible electronic circuits, heat resistant packaging, and cook-in bags, biaxially oriented and heat set PET film having good dimensional stability and shrink resistance at elevated temperatures is used. However, biaxially oriented PET films are not useful at temperatures exceeding 250° C. because their inherent melting temperature (Tm) is 250° C.

Certain applications, such as certain flexible circuit boards, require films that are heat stable (i.e., possessing good dimensional stability) at 260° C. Specifically, the films must not blister or wrinkle when immersed in a solder bath preheated to 260° C. More specifically, these films must undergo 3% or less shrinkage when immersed for 10 seconds in a solder bath preheated to 260° C. Films that meet this requirement are combined with adhesive and circuitry into a flexible laminate that can then be subjected to a wave or dip solder at 260° C. Any blistering or wrinkling of the base film of this laminate during soldering at 260° C. may affect circuit performance in the final application.

Certain high temperature flexible circuit board applications also require that the base film be attached to a copper film by the use of a thermally curable adhesive. These adhesives typically are cured under pressure at temperatures between 120–150° C., and thus the entire laminate structure must be heated to these temperatures in a hot press, autoclave or equivalent equipment. Once the adhesive is cured, the laminate is cooled to room temperature. It is important that the coefficient of thermal expansion (CTE) of the base film and adhesive be sufficiently similar to the CTE of the copper film over the temperature range from 150 to 23° C. so that residual stresses do not develop which might cause the laminate to curl. In order to prevent curl, the base film must have a CTE value of 10–85 ppm/° C., when measured between 120 and 150° C., and preferably also has a CTE value of 10–42 ppm/° C., when measured between 25 and 90° C. Note that these CTE values are specific to biaxially oriented films used to make laminates and are not required in films used for other heat resistant packaging applications, such as cook-in bags, and is not believed to have been addressed in the prior art.

Superior hydrolytic stability is another important requirement for films used in flexible circuit boards, particularly for automotive applications, and cook-in bags. Base films with superior hydrolytic stability produce circuit boards and bags that will maintain their structural integrity. In addition, it is important for the substrate and cover films used in flexible circuit boards to be insulative materials, to prevent charge from bridging across the circuitry. The insulative capability of a film used in these applications is measured by the dielectric constant. It is important for a film used in flexible circuit board applications to have as low a dielectric constant as possible.

Certain polyesters derived from 1,4-cyclohanedimethanol (CHDM) have melting points greater than 250° C. The following references discuss films made from polyesters prepared from CHDM. However, none of the patent references are believed to specifically disclose the fabrication of film that is stable at 260° C.

Defensive Publication T876,001 (1970) describes films made from poly(1,4-cyclohexylenedimethylene terephthalate) (PCT) homopolyesters and copolyesters containing up to 20 mole percent isophthalic acid residues.

Published Patent Application WO 96/06125 (1996) describes biaxially oriented films made from PCT polymers.

Published Patent Application WO 92/14771 (1992) describes PCT polymers having an inherent viscosity (I.V.) less than 0.80 dL/g and wherein the CHDM residues consist of 75 to 100% cis isomer.

JP 1-299019 A (1989) describes biaxially oriented PCT films produced from PCT polymers containing up to 15 mole percent of residues derived from other dicarboxylic acids or other glycols and having an I. V. of at least 0.5 dL/g. JP 2-301419 (1989) describes how the biaxially oriented PCT films discussed in JP 1-299019 do not have 260° C. solder bath resistance, and describes how solder bath resistance can be obtained by irradiating the films discussed in JP 1-299019 to cross link the films. JP 2-196833 A (1990) describes an electric insulation material based on metallized biaxially oriented PCT film. CTE, use temperatures, and flexible circuit board applications are not discussed in this document.

U.S. Pat. No. 4,557,982 (1985), JP 60-069133 A (1985), JP 91-000215 B (1991), JP 60-085437 A (1985) and JP 90-063256 B (1990) describe PCT polymers containing at least 80 mole percent terephthalic acid residues and at least 90 mole percent CHDM (60 to 100% trans isomer) residues. Biaxially oriented films with high biaxial orientation are useful in making magnetic tapes.

JP 58-214208 A (1983) describes films made from PET, PCT and copolyesters useful for electrical insulation and flexible printed circuit base film. U.S. Pat. No. 5,153,302 (1992) and JP 4-214757 A (1992) describes PCT and PCT copolyesters containing at least 97 mole percent CHDM residues and at least 90 mole percent terephthalic acid residues and the use of the polymers to make capacitor films. U.S. Pat. No. 3,284,223 (1966) describes PCT polymers containing up to 25 mole percent of residues derived from other dicarboxylic acids or other glycols.

BRIEF SUMMARY OF THE INVENTION

While many embodiments are contemplated within the scope of this invention, several examples of embodiments are specifically illustrated herein.

In the first embodiment of this invention, a biaxially oriented polyester film is provided which is produced from a polyester comprising:
(1) diacid residues comprising at least 90 mole percent of terephthalic acid residues, naphthalenedicarboylic acid residues or combinations thereof; and
(2) diol residues comprising at least 90 mole percent of 1,4-cyclohexanedimethanol residues; wherein the polyester comprises a total of 100 mole percent diacid residues and a total of 100 mole percent diol residues;

wherein a film of the polyester is stretched or oriented at stretch ratios and stretch temperatures that satisfy the equation $(27*R)-(1.3*(T-Tg))\geq 27$, wherein T is the average of the machine and transverse direction stretch temperatures in degrees Celsius, Tg is the glass transition temperature of the polymer film in degrees Celsius and R is the average of the machine and transverse direction stretch ratios and the stretched film is heat-set at an actual film temperature of from 260° C. to Tm, wherein Tm is the melting point of the polymer as measured by differential scanning calorimetry (DSC), for a time at the actual film temperature of between 1 and 120 seconds, preferably, 1 to 60 seconds, while maintaining the dimensions of the stretched film. It is preferred that the biaxially oriented and heat-set polyester film undergoes not more than 3% shrinkage when immersed for 10 seconds in a solder bath preheated to 260° C. and exhibits a coefficient of thermal expansion value of 10–85 ppm/° C., when measured between 120 and 150° C. The low value of shrinkage is preferred to produce laminates with adhesive and circuitry to form a flexible laminate that can then be subjected to a wave or dip solder at 260° C. The base film of this laminated circuit preferably should not blister or wrinkle during soldering, as this can affect circuit performance in the final application. The terms "actual film temperature" specified above refer to the actual temperature of the film, and not the temperature that the air is heated to.

A second embodiment of the present invention is a biaxially oriented polyester film which is produced from a polyester comprising:
(1) diacid residues comprising at least 90 mole percent of terephthalic acid residues, naphthalenedicarboxylic acid residues or combinations thereof; and
(2) diol residues comprising at least 90 mole percent of 1,4-cyclohexanedimethanol residues; wherein the polyester comprises a total of 100 mole percent diacid residues and a total of 100 mole percent diol residues;

wherein said polyester film undergoes not more than 3% shrinkage when immersed for 10 seconds in a solder bath preheated to 260° C. and exhibits a coefficient of thermal expansion value of 10–85ppm/° C., when measured between 120 and 150° C., and preferably, a coefficient of thermal expansion value of 10–42 ppm/C., when measured between 25 and 90° C.

A third embodiment of the present invention is a thermoplastic article obtained by applying heat and pressure to one or more laminates wherein at least one of said laminates comprises, in order:
I. at least one thermally curable adhesive; and
II. at least one layer of the biaxially oriented and heat-set polyester film defined above in the first and second embodiments.

A fourth embodiment of the present invention is a thermoplastic article obtained by applying heat and pressure to one or more laminates wherein at least one of said laminates comprises, in order:
I. at least one copper layer;
I. at least one thermally curable adhesive; and
II. at least one layer of the biaxially oriented and heat-set polyester film defined above.

A fifth embodiment of the present invention is a process for the preparation of a thermoplastic article wherein heat and pressure are applied to one or more laminates, wherein at least one of said laminates comprises, in order:
(a) at least one copper layer;
(b) at least one thermally curable adhesive; and
(c) the biaxially oriented and heat-set polyester film as defined above for the first and second embodiments; and wherein said heat is applied to said laminate at a temperature of about 120 to 180° C., preferably, about 120 to 150° C., for a period of time sufficient to cure the thermally curable adhesive.

A sixth embodiment of the present invention is a flexible electronic circuit board comprising at least one biaxially oriented polyester film as defined for the first and second embodiments.

A seventh embodiment of the present invention is a process for the preparation of the aforesaid film laminate comprising the steps of:
(1) preparing a multi-layer sandwich comprising, in order:
  (a) at least one thermally curable adhesive layer; and
  (b) at least one layer of the biaxially oriented polyester film of the first and second embodiments; and
(2) heating the multi-layer sandwich of step (1) at a temperature of about 120 to 150° C. for a period of time sufficient to cure the thermally curable adhesive.

DETAILED DESCRIPTION

Figure 1:
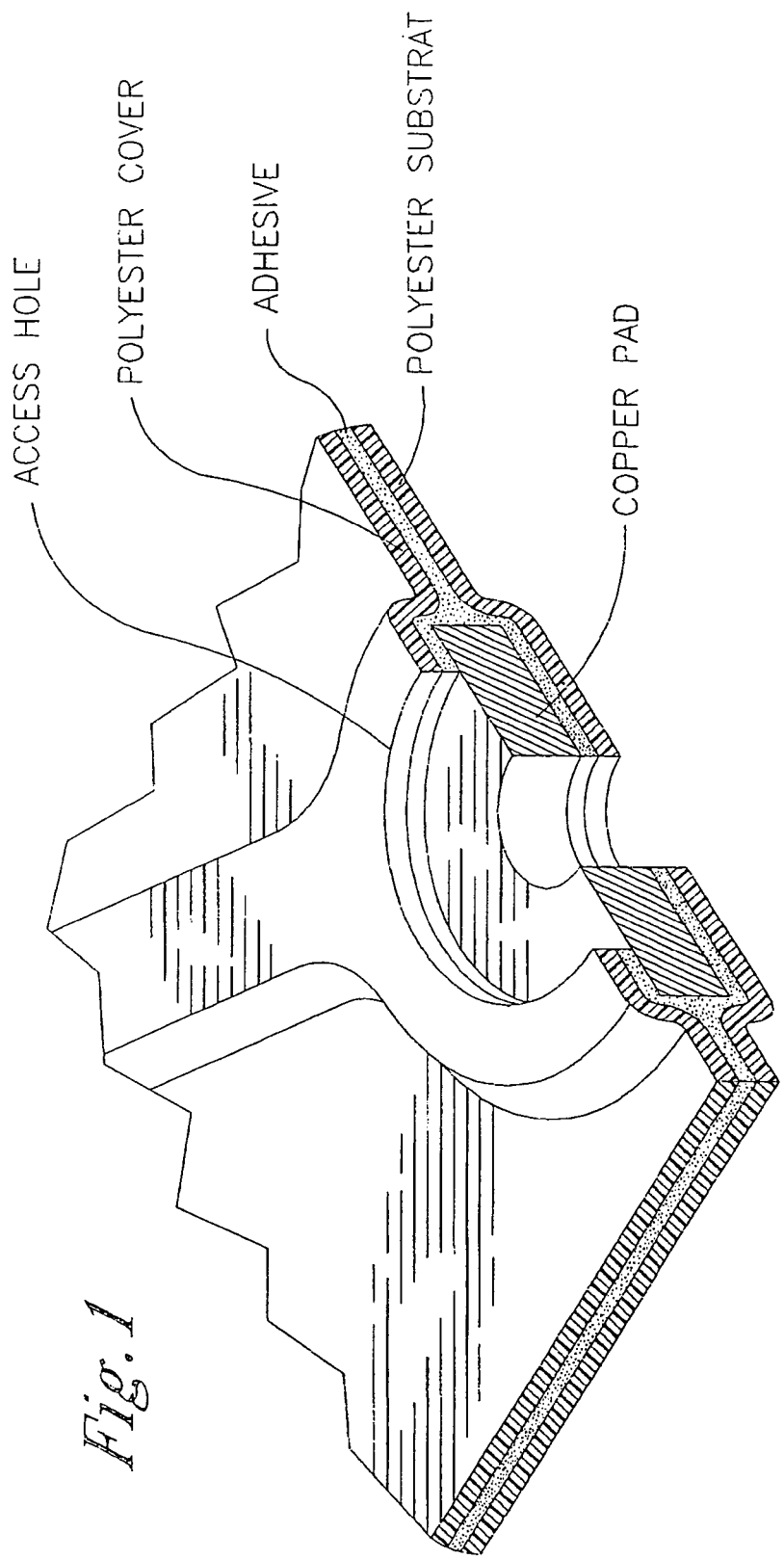
FIG. 1 is a representation of a single layer flexible electronic circuit useful in the invention.

The polyesters for all embodiments of the invention comprise:
(1) diacid residues comprising at least 90 mole percent, but preferably at least 97 mole percent, of terephthalic acid residues, naphthalenedicarboylic acid residues or mixtures thereof, but more preferably at least 90 mole percent of terephthalic acid residues, and even more preferably 97 mole percent of terephthalic acid residues; and
(2) diol residues comprising at least 90 mole percent, preferably at least 97 mole percent of 1,4-cyclohexanedimethanol (CHDM) residues.

Even more preferred are polyesters consisting essentially of:
(1) diacid residues consisting essentially of terephthalic acid residues; and
(2) diol residues consisting essentially of 1,4-cyclohexanedimethanol residues.

The CHDM residues may have any combination of cis and trans isomer ratios. However, preferably, the CHDM residues have a trans isomer content in the range of about 60 to 100%. A more preferred isomer content is in the range of about 60 to about 80% trans isomer.

It is preferred that the polyesters utilized in some or all embodiments of the present invention are crystalline or crystallizable and have melting points greater than about 260° C., preferably greater than about 270° C., e.g., from about 270 to 330° C. and more preferably, from about 280 to 300° C.

The polyesters are readily prepared by conventional methods well known in the art. For example, melt phase or a combination of melt phase and solid phase polycondensation techniques may be used if desired. The polyesters typically have an I.V. of about 0.4 to 1.2, preferably about 0.5 to 1.1, and more preferably, 0.7 to 1.0. As used herein, I.V. refers to viscosity determinations made at 25° C. using 0.50 gram of polymer per 100 mL of a solvent composed of 60 weight percent phenol and 40 weight percent tetrachloroethane. The basic method of determining the I.V. of the polyesters herein is set forth in ASTM method D2857-95. Any of the naphthalenedicarboxyllic acid isomers may be used but the 1,4-, 1,5-, 2,7- and, especially, 2,6-isomers are preferred. The diacid residues of the polyesters may be derived from the dicarboxylic acid or a derivative of the diacid such as the lower alkyl esters, e.g., dimethyl terepthalate, acid halides, e.g., diacid chlorides, or, in some cases, anhydrides.

The polyesters may contain minor amounts of residues of other dicarboxylic acids or other glycols if desired but modifying amounts of such materials should be small, for example, not more than about 10 mole percent in order to maintain a high level of crystallinity and high melting point in the polymer. Useful modifying monomers include other dicarboxylic acids containing about 4 to about 14 carbon atoms and other glycols containing about 2 to about 12 carbon atoms. Preferred modifying acids include isophthalic acid and 1,4-cyclohexanedicarboxylic acid. Some preferred modifying glycols include ethylene glycol, 1,3-propanediol, 1,6-hexanediol and neopentyl glycol.

Examples of the catalyst materials that may be used in the synthesis of the polyesters utilized in the present invention include titanium, manganese, zinc, cobalt, antimony, gallium, lithium, calcium, silicon and germanium. Such catalyst systems are described in U.S. Pat. Nos. 3,907,754, 3,962,189, 4,010,145, 4,356,299, 5,017,680, 5,668,243 and 5,681,918, herein incorporated by reference in their entirety. Preferred catalyst metals include titanium and manganese and most preferred is titanium. The amount of catalytic metal used may range from about 5 to 100 ppm but the use of catalyst concentrations of about 5 to about 35 ppm titanium is preferred in order to provide polyesters having good color, thermal stability and electrical properties. Phosphorus compounds frequently are used in combination with the catalyst metals and any of the phosphorus compounds normally used in making polyesters may be used. Up to about 100 ppm phosphorus typically may be used.

Although not required, other additives typically present in polyesters may be used if desired so long as they do not hinder the performance of the polyesters used to prepare the film. Such additives may include, but are not limited to, antioxidants, ultraviolet light and heat stabilizers, metal deactivators, colorants, pigments, impact modifiers, nucleating agents, branching agents, flame retardants, and the like.

Branching agents useful in making the polyesters formed within the context of the invention can be ones which provide branching in the acid unit portion of the polyester, or in the glycol unit portion, or it can be a hybrid. Some of these branching agents have already been described herein. However, illustrative of such branching agents are polyfunctional acids, polyfunctional anhydrides, polyfunctional glycols and acid/glycol hybrids. Examples include tri or tetra-carboxylic acids and their corresponding anhydrides, such as trimesic acid, pyromellitic acid and lower alkyl esters thereof and the like, and tetrols such as pentaerythritol. Also triols such as trimethylopropane or dihydroxy carboxylic acids and hydroxydicarboxylic acids and derivatives, such as dimethyl hydroxy terephthalate, and the like are useful within the context of this invention. Trimellitic anhydride is a preferred branching agent.

In the first step of the process for preparing the polyester film or sheet material, a melt of the polyester described above is extruded into essentially amorphous film at any temperature known in the art, e.g., typically at a temperature of about 270 to 310° C. The thickness of the unstretched (or unoriented) film normally is in the range of 100 to 1000 microns, more typically about 200 to 600 microns. The initial film extrusion can be performed by any usual method, including but not restricted to extrusion on a single screw extruder or extrusion on a twin screw extruder. The film is then stretched or oriented at stretch ratios and stretch temperatures that satisfy the equation $(27*R)-(1.3*(T-Tg)) \geq 27$, wherein T is the average of the machine and transverse direction stretch temperatures in degrees Celsius, Tg is the glass transition temperature of the polymer film in degrees Celsius and R is the average of the machine and transverse direction stretch ratios. The designation "X" refers to the stretch ratio, which is the extent to which the film is stretched relative to the original dimensions of the film. For example, 2× means that the film has been stretched to a dimension that is twice its original dimension. Preferably, the film is stretched at a ratio of about 2.5× to 3× in the machine direction (MD) and about 2.5× to 3× in the transverse direction (TD) and at stretching temperatures between 90 and 110° C. After stretching, the films are heat-set at actual film temperatures of from 260° C. to Tm, wherein Tm is the melting point of the polymer as measured by differential scanning calorimetry (DSC), for a period of time greater than about 5 seconds. Note that, depending on the heating source of the oven (i.e., convection, radiation, etc.) there may be an amount of time required to heat the film up to 260° C. This time may be up to 30 seconds. This additional time is not included in the heatset time listed herein, which refers only to the time that the sample actually spends at from 260° C. to Tm. The initial film extrusion can be performed immediately prior to stretching (i.e., in-line), or at a separate time. During heat-setting, the stretched film is maintained in the stretched dimensions of the film, by means of a tenter frame or other mechanical device that prevents excessive relaxation of the stretched film during heat-setting. During heat-setting the film can be stretched or relaxed by up to 10%, i.e., the overall dimension of the film can be increased or decreased by up to 10%.

Any conventional method may be used in stretching or orienting any film of the invention. For example the extruded polyester film may be stretched by roll stretching, long-gap stretching, tenter stretching, tubular stretching, or combinations thereof. With any of these methods, it is possible to do sequential biaxial stretching, simultaneous biaxial stretching, uniaxial stretching or combinations thereof. Simultaneous biaxial stretching involves stretching the machine and transverse directions of the film at the same time. In a simultaneous biaxial stretch, the stretch ratio does not have to be the same in the transverse direction as it is in the machine direction. Sequential biaxial stretching involves first stretching in the machine direction, for example in a roll to roll stretch, and then subsequently stretching in the transverse direction, for example, using a tenter frame. In a sequential stretching process, the two stretches may be performed one immediately after the other (i.e., in line) or at separate times. The machine direction is defined as the long direction of the film, as it is rolled. The transverse direction is defined as the width of the film, i.e, the direction perpendicular to the machine direction. If a sequential biaxial stretch is performed, the stretch ratio and temperature of the stretch do not have to be the same in the transverse direction as it is in the machine direction.

The stretch or oriented polyester film is heat-set according to known methods. Heat setting may occur in a continuous process, for example, passing a roll of stretched film continuously through an oven, or as a batch process, for example, wherein films are placed in heat-set frames and placed individually in a heat-setting oven for a fixed length of time. Heat-setting may be performed immediately after stretching (i.e., in-line), or at separate times. The film may be relaxed or expanded by up to 10% during heat-setting.

The number of stretching and heat-setting steps may be varied. The polyester film may be subjected to a single stretch and single heat-set pass or treatment, a single stretch and multiple heat-set passes, multiple stretch and a single heat-set pass, or multiple stretch and multiple heat-set passes. If multiple stretch and/or heat-set passes are performed, it is possible that the stretch and heat-set passes may alternate in timing, but it is also possible that one heat-set pass may follow a prior heat-set pass without an intervening stretch pass. The conditions of each pass do not have to be the same as the previous pass. For example, the polyester film may be heat-set by a two-stage heat-set process whereby the first heat-set is performed at any actual film temperature above the stretch temperature. Subsequently, the film is heat-set a second time at actual film temperatures in a range of from 260° C. to Tm, wherein Tm is the melting point of the polymer, measured by DSC (differential scanning calorimetry). The polyester film component of the laminate of the present invention normally has a final thickness value, i.e., after stretching and heat-setting, of about 0.02 to 0.2 mm (about 0.8 to 8 mil), preferably about 0.04 and 0.13 mm (about 1.5 to 5 mil).

A biaxially oriented polyester film of the invention is produced from a polyester as defined herein: wherein a film of the polyester is stretched or oriented at stretch ratios and stretch temperatures that satisfy the equation $(27*R)-(1.3*(T-Tg)) \geq 27$, where T is the average of the machine and transverse direction stretch temperatures in degrees Celsius, Tg is the glass transition temperature of the polymer film in degrees Celsius and R is the average of the machine and transverse direction stretch ratios and the stretched film is subsequently heat-set at an actual film temperature of from 260° C. to Tm, wherein Tm is the melting point of the polyester as measured by differential scanning calorimetry (DSC), while maintaining the dimensions of the stretched film.

While the polyester film as described in the preceding paragraph is a preferred embodiment of the invention, it is not required that the film meet the equation as defined above. Alternatively, a biaxially oriented polyester film which is produced from a polyester as defined herein is provided, which does not necessarily have to meet the equation described in the previous paragraph, wherein said polyester film undergoes not more than 3% shrinkage when immersed for 10 seconds in a solder bath preheated to 260° C. and exhibits a coefficient of thermal expansion value of 10–85 ppm/° C., when measured between 120 and 150° C.

For all embodiments of the invention, the polyester films of the invention preferably exhibit less than 3% shrinkage when immersed for 10 seconds in a solder bath preheated to 260° C. and preferably can have a CTE of 10–42 ppm/° C., when measured between 25 and 90° C., and/or of 10–85 ppm/° C., when measured between 120 and 150° C. Furthermore, the polyester film preferably does not blister or wrinkle when immersed for 10 seconds in a solder bath preheated to 260° C. The polyester film also exhibits improved hydrolytic resistance as compared to similar film prepared from PET and improved dielectric constant compared to film prepared from PET and polyimide. The polyester films of the invention may be useful for any application requiring film that requires dimensional stability at elevated temperatures. Particular end uses noted as examples herein are flexible circuit boards, conductive layers for films in flexible touch screen displays, liquid crystal displays, electrochromic displays, photovoltaic devices (i.e., solar cells), OLEDs (organic light emitting diodes), micro-fluidic devices (disposable medical test kits), among others. End uses particularly preferred for films of this invention are ones requiring dimensional stability at 260° C. and above.

The novel laminate structures may utilize any of the films or polyesters provided by the present invention and may comprise, in order, at least one thermally or UV curable or cured adhesive layer; and at least one biaxially oriented and heat-set polyester layer. A copper/polyester laminate is also provided by the invention, which comprises, in order, at least one copper layer, at least one thermally or UV curable or cured adhesive layer and at least one biaxially oriented and heat-set polyester layer. The copper layer consists of metallic copper foil typically having as thickness of about 17 to 140 microns, preferably about 30 to 70 microns. The copper foil may be wrought or rolled or electrodeposited copper foil. The thermally curable adhesive layer may be selected from a variety of known adhesive compositions such as acrylic, flame retardant (FR) acrylic, butyral phenolic, acrylic epoxy, polyester, epoxy polyester, modified epoxy and the like. These adhesives typically are cured by application of or exposure to heat to cause the adhesive to be heated to a temperature of about 120 to 180° C. for a period of about 30 minutes to an hour under pressures of about 700 to 3500 kilopascals (100 to 500 pounds per square inch). The thickness of the cured adhesive layer typically is in the range of about 15 to 100 microns. Processes of preparing thermoplastic articles comprising these laminate structures are also provided which comprise applying heat and pressure to said laminate structures. The laminate structures of the invention may be used in any use known in the art or described herein, but are preferably used in flexible electronic circuit boards. The laminates of the invention can be used in single layer electronic circuit, a two-layer electronic circuit and/or a multi-layer electronic circuit, for example, as depicted in FIGS. 1–3.

As shown, a thermoplastic article may also be obtained by applying heat and pressure to multiples of laminates as described above or "sandwiches". In the multilaminate embodiments and/or "sandwich" structures, an adhesive layer such as that described above can also be applied between laminates.

Figure 2:
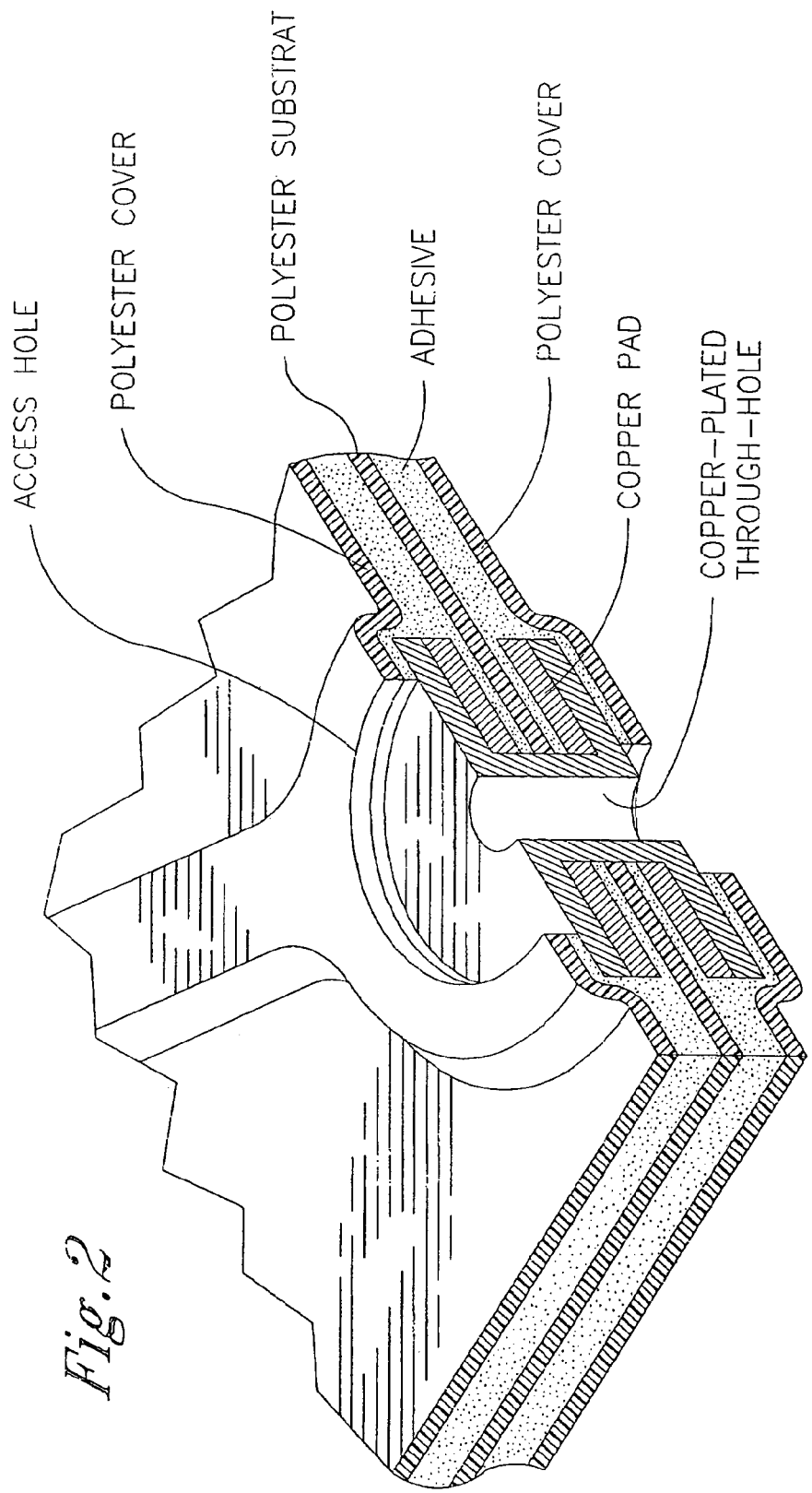
FIG. 2 is a representation of a double layer flexible electronic circuit useful in the invention.
Figure 3:
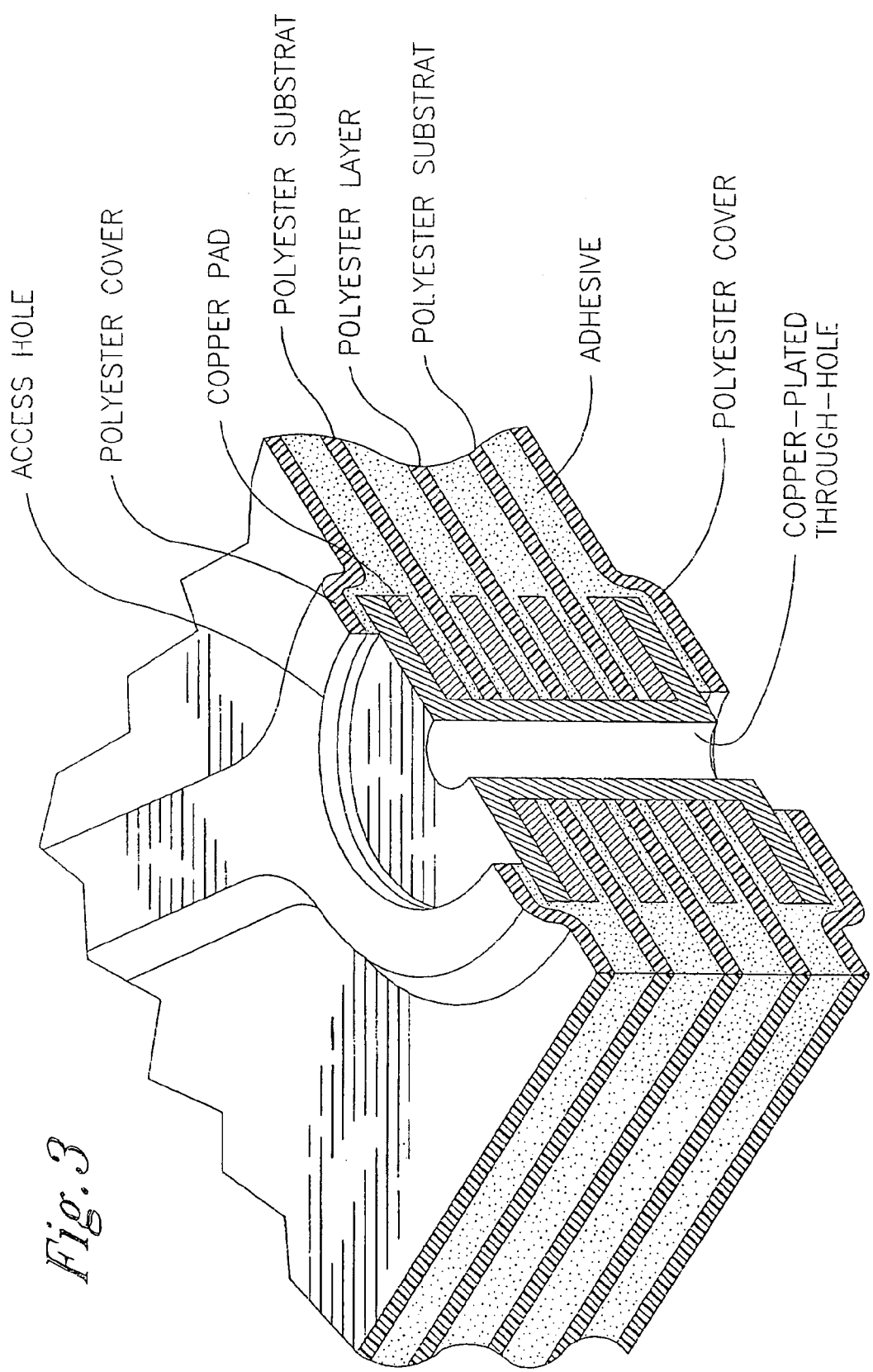
FIG. 3 is a representation of a multi-layer flexible electronic circuit useful in the invention.

In FIGS. 1–3, the polyester films of the invention can be used as the outer layer and/or as an inner layer for an flexible electronic circuit whether or not it is called a polyester substrate (substrat), a polyester cover, or another term. It is not intended that the invention be limited by the terms "substrate", "substrat", or "cover" as depicted in the drawings.

The Linear coefficient of thermal expansion (CTE) of film samples was measured according to IPC-TM-650 2.4.41.3 using a Rheometrics RSA II dynamic mechanical thermal analysis (DMTA) instrument and is further exemplified by the following examples.

This invention can be further illustrated by the following examples of preferred embodiments thereof, although it will be understood that these examples are included merely for purposes of illustration and are not intended to limit the scope of the invention unless otherwise specifically indicated. Unless otherwise indicated, all weight percentages are based on the total weight of the polymer composition and all molecular weights are weight average molecular weights. Also, all percentages are by weight unless otherwise indicated.

EXAMPLES

The polyester film and the preparation thereof according to the present invention are further illustrated by the following examples. Solder resistance as defined by the present invention is measured according to IPC-TM-650 2.4.13.1 with the solder bath temperature set at 260° C. The specimens tested in the examples that follow were not made into laminates, were not etched and were unclad, i.e., neither coated nor laminated. Film shrinkage is determined by measuring the dimensions of a 5.1 cm×5.1 cm (2×2 inch) film sample at two locations in the MD (machine direction) and two locations in the TD (transverse direction). The film sample then is immersed in a solder bath preheated to 260° C. for 10 seconds as described herein. The film is observed for blisters and wrinkles. The dimensions are then measured again. Each after immersion dimension is subtracted from the original dimension and then divided by the original dimension to obtain a % shrinkage. The four % shrinkage values (2 for MD and 2 for TD) are averaged together to obtain the overall % shrinkage.

Glass transition temperatures and Melt temperatures as defined by the present invention are measured using differential scanning calorimetry (DSC) in accordance with ASTM D3418. Each sample of 15.0 mg is sealed in an aluminum pan and heated to 290° C. at a rate of 20° C./minute. The sample then is cooled to below its glass transition at a rate of about 320° C./minute to generate an amorphous specimen. The melt temperature, Tm, corresponds to the peak of the endotherm observed during the scan. The Linear coefficient of thermal expansion (CTE) of film samples as defined by the present invention was measured according to IPC-TM-650 2.4.41.3 using a Rheometrics RSA II dynamic mechanical thermal analysis (DMTA) instrument. The procedure was to mount a nominal 2 mm wide by 22 mm long film specimen in the DMTA instrument clamps. The DMTA force was set at a constant 2 grams. The sample was cooled to −10° C., heated to 150° C., re-cooled to −10° C., and then re-heated to 150° C., all at a 10° C./min heating/cooling rate. The length of the sample as a function of temperature was measured during the second heating scan. The sample length-temperature slope was determined over the temperature ranges 25–90° C. and 120–150° C. Two calibrations were performed; one to establish a baseline for the DMTA and one to calibrate the machine response to different standards. Copper, aluminum and several amorphous plastics with known values of CTE were used as calibration standards. This calibration was then used to calculate the CTE of unknown samples from their measured length-temperature slopes over the temperature ranges 25–90° C. and 120–150° C.

Example 1 and Comparative Examples C-1–C-3

Example 1 and Comparative Examples C-1–C-3 demonstrate the effect of heat-set temperature on shrinkage of films prepared from PCT. Pellets of PCT polyester (I.V. 0.74, Tm 293° C., Tg 94° C.) are prepared in a melt phase polycondensation process using 100 ppm Ti catalyst (as titanium isobutoxide). The pellets are dried at 135° C. for 6 hours and subsequently extruded into 2.032 mm (8 mil) thick sheeting on a Davis Standard 5.1 cm (2.0 inch) extruder equipped with a polyester barrier-type screw. The melt temperature and die temperature are maintained at 293° C. The sheet is cast onto a 2-roll down-stack with roll temperatures set at 66° C. (150° F.). The films then were biaxially oriented on a T. M. Long film stretching machine, with both axes stretched simultaneously and to the same stretch ratio and at the same rate of 35.56 cm (14 inches) per second at the conditions indicated in Table I. The films then are clamped into an aluminum frame and inserted into a box oven at the set temperature and time indicated in Table I to heat-set them. Two films were placed in the frame, and a thermocouple was sandwiched between the two films to measure the actual film temperature, also shown in Table I. Note that the set temperature is higher than the actual film temperature and that the heat set time listed includes the time (approximately 30 seconds) required to heat the sample to the actual film temperature. After heat-setting, the film is immersed for 10 seconds in a solder bath preheated to 260° C. and the resulting % shrinkage is shown in Table I. Examples C-1–C-3 are comparative examples, produced under a variety of stretching conditions, that demonstrate that heat-setting below a 260° C. actual film temperature produces films with high levels of shrinkage at 260° C. Blisters had formed in the comparative films during the solder bath immersion. This high degree of shrinkage is not acceptable for the manufacture of the laminates of the present invention when used in the manufacture of electrical connectors or flexible circuit films. Note that the film of Comparative Example C-1 is stretched and heat-set under conditions identical to those reported in Example 3 of WO/06125. Example 1 is an example of film according to the present invention that has been heat-set at a temperature that produces a film with acceptable shrinkage. The CTE of this film also is acceptable. In Table I, the stretch ratios refer to stretching in both the machine and transverse directions, Temperatures are given in ° C., Time is in seconds, % Shrinkage refers to the percentage that the samples of film shrank after being immersed for 10 seconds in a solder bath preheated to 260° C., CTE values refer to ppm/° C., and film thickness is given in microns.

TABLE I

|  | EXAMPLES | | | |
| --- | --- | --- | --- | --- |
|  | C-1 | C-2 | C-3 | 1 |
| Stretch Ratio | 2.5 | 2 | 2 | 2 |
| Stretch Temperature | 130 | 100 | 100 | 100 |
| Heat-set Temperature | 250 | 250 | 270 | 290 |
| Heat-set Time | 120 | 60 | 60 | 60 |
| Actual Film Temperature | 236 | 235 | 246 | 274 |
| % Shrinkage | 8.0% | 14.2% | 9.0% | 1.7% |
| CTE (23–90° C.) | — | — | — | 34 |

TABLE I-continued

| | EXAMPLES | | | |
|---|---|---|---|---|
| | C-1 | C-2 | C-3 | 1 |
| CTE (120–150° C.) | — | — | — | 65 |
| Film Thickness | 31 | 51 | 51 | 51 |

Examples 2–4 and Comparative Examples C-4 and C-5

Examples 2–4 are examples of polyester films according to our invention and along with Comparative Examples C-4 and C-5 demonstrate the effect of stretch ratio and stretch temperature on shrinkage and CTE of films made from PCT. Pellets of PCT polyester (I.V. 0.74, Tm 293° C., Tg 94° C.) are prepared into films as described in the prior examples The films then were biaxially oriented on a T. M. Long film stretching machine, with both axes stretched simultaneously and to the same stretch ratio and at the same rate of 35.56 cm (14 inches) per second at the conditions indicated in Table II. The films then are clamped into an aluminum frame and inserted into a box oven at the heat-set zone set temperature and time shown in Table II to heat-set them. Two films were placed in the frame, and a thermocouple was sandwiched between the two films to measure the actual film temperature, also shown in Table II. Note that the set temperature is higher than the actual film temperature and that the heat set time listed includes the time (approximately 30 seconds) required to heat the sample to the actual film temperature. The heat-set film is immersed for 10 seconds in a solder bath preheated to 260° C. and the resulting % shrinkage is shown in Table II. Example 1 is included in this Table II for reference. Examples 1–4 all have acceptable shrinkage and CTE and were stretched under conditions that satisfy the equation $(27*R)-(1.3*(T-Tg)) \geq 27$, where T is the average of the machine and transverse direction stretch temperatures in degrees Celsius, Tg is the glass transition temperature of the polymer film in degrees Celsius and R is the average of the machine and transverse direction stretch ratios. These films were heatset at actual film temperatures of 260° C. or greater. Comparative examples C-4 and C-5 were stretched at conditions that do not satisfy the equation $(27*R)-(1.3*(T-Tg)) \geq 27$ and have unacceptable CTE values. Note that the film of Comparative Example C-5 is stretched and heat-set under conditions identical to those reported in Example 2 of WO/06125. It is also noteworthy that Examples 3 and 4 were acceptable, as WO/06125 explicitly states that "PCT behaves differently than PET in that once the film is stretched beyond 2.5x, no amount of heat-setting (time or temperature) can anneal the internal stresses generated during the stretching process". In Table II, the stretch ratios refer to stretching in both the machine and transverse directions, Temperatures are given in ° C., Time is in seconds, % Shrinkage refers to the percentage that the samples of film shrank after being immersed for 10 seconds in a solder bath preheated to 260° C., CTE values refer to ppm/° C., and film thickness is given in microns.

TABLE II

| | EXAMPLES | | | | | |
|---|---|---|---|---|---|---|
| | 1 | 2 | C-4 | C-5 | 3 | 4 |
| Stretch Ratio | 2 | 2.5 | 2 | 2.5 | 3 | 3.5 |
| Stretch Temperature | 100 | 100 | 130 | 130 | 130 | 130 |
| Heat-set Temperature | 290 | 290 | 290 | 280 | 290 | 290 |
| Heat-set Time | 60 | 60 | 120 | 120 | 60 | 60 |
| Actual Film Temperature | 274 | 272 | 279 | 260 | 276 | 269 |
| % Shrinkage | 1.7% | 2.5% | 1.7% | 1.4% | 1.5% | 2.7% |
| CTE (23–90° C.) | 34 | 29 | 57 | 47 | 42 | 33 |
| CTE (120–150° C.) | 65 | 51 | 146 | 100 | 80 | 61 |
| Film Thickness | 51 | 31 | 51 | 31 | 23 | 15 |

Examples 5–8 and Comparative Examples C-6 –C-9

Examples 5–8 and Comparative Examples C-6–C-9 demonstrate the effect of heatset temperature and time on shrinkage and CTE of films made from PCT using a sequential stretch and tenter process. Pellets of PCT polyester (I.V. 0.74, Tm 293° C., Tg 94° C.) are prepared in a melt phase polycondensation process using 100 ppm Ti catalyst (as titanium isobutoxide). The pellets are dried at 120° C. for 16 hours and subsequently extruded into 0.460 mm (18 mil) thick sheeting on a Davis Standard 6.4 cm (2.5 inch) extruder equipped with a polyester barrier type screw. The melt temperature and die temperature are maintained at 300° C. degrees C. The sheet is cast onto a 3-roll down-stack with roll temperatures set at 49° C./57° C./66° C. (120° F./135° F./150° F.) from top to bottom, respectively. The films then were stretched and tentered on a commercial tenter apparatus with the machine direction stretched on a roll stack at the ratio and temperature shown in Table III and the transverse direction subsequently stretched between clips in a tenter frame at the conditions shown in Table III. The films immediately pass into an annealing zone, which provides the first heat-set treatment or pass. This annealing zone is set at the heat-set zone set temperature and time indicated in Table III. Actual film temperatures in the annealing zone are obtained by placing a temperature indicating tape onto the film. This tape changes color at a series of known temperatures to indicate the maximum temperature the film experienced. In Example 7 and Comparative Examples C-8 and C-9, a second heat-set treatment is performed by clamping the films into an aluminum frame which is then inserted into a box oven at the heat-set zone set temperature and time indicated in Table III. For these examples, two films were placed in the frame, and a thermocouple was sandwiched between the two films to measure the actual film temperature. In Example 8, a second heat-set treatment is performed by passing the film a second time through the annealing zone of the tenter frame at the heat-set zone set temperature and time indicated in Table III. The actual film temperature listed is the highest temperature attained during the combination of first and second heatset. Note that the set temperature is higher than the actual film temperature and that the heat set time listed includes the time required to heat the sample to the actual film temperature. Because of the time required for the film to heat up, the actual film temperature shown is a function of both set temperature and time. The heat-set film is immersed for 10 seconds in a solder bath preheated to 260° C. and the resulting % shrinkage is shown in Table III. Comparative Examples C-6–C-9 show how actual film temperatures below 260° C. do not provide sufficient shrinkage at 260° C. The films of Examples 5–8 have acceptable shrinkage and CTE. In Table III, MD Stretch Ratios refer to stretching in the machine direction, TD Stretch Ratios refer to stretching in the transverse direction, Temperatures are given in ° C., Time is in seconds, n/a means that a second heat-set treatment was not performed, % Shrinkage refers to the percentage that the samples of film shrank after being immersed for 10 seconds in a solder bath preheated to 260° C. solder bath for 10 seconds and CTE values refer to ppm/° C. and film thickness is given in microns.

TABLE III

|  | EXAMPLES | | | | | | | |
| --- | --- | --- | --- | --- | --- | --- | --- | --- |
|  | C-6 | C-7 | 5 | 6 | C-8 | C-9 | 7 | 8 |
| MD Stretch Ratio | 2.5 | 2.5 | 2.5 | 2.5 | 2.5 | 2.5 | 2.5 | 2.5 |
| MD Temperature | 91 | 91 | 91 | 91 | 91 | 91 | 91 | 91 |
| TD Stretch Ratio | 2.5 | 2.5 | 2.5 | 2.5 | 2.5 | 2.5 | 2.5 | 2.5 |
| TD Temperature | 99 | 99 | 99 | 99 | 99 | 99 | 99 | 99 |
| 1st Heat-set Temperature | 288 | 304 | 304 | 304 | 288 | 288 | 288 | 288 |
| 1st Heat-set Time | 9 | 13 | 35 | 106 | 9 | 9 | 9 | 9 |
| 2nd Heat-set Temperature | n/a | n/a | n/a | n/a | 270 | 290 | 290 | 299 |
| 2nd Heat-set Time | n/a | n/a | n/a | n/a | 60 | 9 | 60 | 33 |
| Actual film temp | 200 | 245 | 260 | 267 | 248 | 200 | 275 | 271 |
| Solder Bath % shrink | 9.9% | 4.9% | 2.4% | 0.9% | 5.3% | 12.6% | 0.9% | 1.2% |
| CTE (23–90 C.) | 24 | 34 | 37 | 31 | 30 | 23 | 33 | 42 |
| CTE (120–150 C.) | 37 | 59 | 72 | 75 | 50 | 44 | 81 | 71 |
| Film Thickness | 75 | 75 | 75 | 75 | 75 | 75 | 75 | 75 |

The invention has been described in detail with particular reference to preferred embodiments thereof, but it will be understood that variations and modifications can be effected within the spirit and scope of the invention.

We claim:

1. A biaxially oriented polyester film produced from a polyester comprising:
   (1) diacid residues comprising at least 90 mole percent of terephthalic acid residues, naphthalenedicarboylic acid residues or combinations thereof; and
   (2) diol residues comprising at least 90 mole percent of 1,4-cyclohexanedimethanol residues,
   wherein the polyester film is stretched at a ratio of about 2.5× to 3× in the machine direction (MD) and about 2.5× to 3× in the transverse direction (TD) at stretching temperatures between 90 and 110° C.,
   wherein the stretched film is subsequently heat-set at an actual film temperature of from 260° C. to Tm, wherein Tm is the melting point of the polyester as measured by differential scanning calorimetry (DSC), while maintaining the dimensions of the stretched film, and
   wherein the biaxially oriented and heat-set polyester film undergoes not more than 3% shrinkage when immersed for 10 seconds in a solder bath preheated to 260° C. and exhibits a coefficient of thermal expansion value of 10–85 ppm/° C. when measured between 120 and 150° C., and a coefficient of thermal expansion value of 10–42 ppm/° C. when measured between 25 and 90° C.

2. The biaxially oriented polyester film of claim 1 wherein the polyester has a melting point of at least 270° C. and an inherent viscosity of 0.4 to 1.2 as measured at 25° C. using 0.50 gram of polymer per 100 mL of a solvent composed of 60 weight percent phenol and 40 weight percent tetrachloroethane according to ASTM method D2857-95, and comprises:
   (1) diacid residues comprising at least 97 mole percent of terephthalic acid residues, naphthalenedicarboylic acid residues or combinations thereof; and
   (2) diol residues comprising at least 97 mole percent of 1,4-cyclohexanedimethanol residues.

3. The biaxially oriented polyester film of claim 1 wherein the polyester film is sequentially stretched in the machine and the tranverse directions, and the stretched film is heat-set at an actual film temperature of from 260° C. to Tm for a period of time of 1 to 120 seconds while maintaining the dimensions of the stretched film.

4. The biaxially oriented polyester film of claim 1 wherein the polyester film is simultaneously stretched in the machine and the transverse directions, and the stretched film is heat-set at an actual film temperature of from 260° C. to Tm for a period of time of 1 to 120 seconds while maintaining the dimensions of the stretched film.

5. A thermoplastic article comprising one or more laminates, wherein at least one of said laminates comprises in order:
   I. a thermally curable adhesive; and
   II. a biaxially oriented and heat-set polyester film produced from a polyester comprising:
   (1) diacid residues comprising at least 90 mole percent of terephthalic acid residues, naphthalenedicarboylic acid residues or combinations thereof; and
   (2) diol residues comprising at least 90 mole percent of 1,4-cyclohexanedimethanol residues,
   wherein said polyester film is stretched at a ratio of about 2.5× to 3× in the machine direction (MD) and about 2.5× to 3× in the transverse direction (TD) at stretching temperatures between 90 and 110° C.,
   wherein the stretched film is subsequently heat-set at an actual film temperature of from 260° C. to Tm, wherein Tm is the melting point of the polymer as measured by differential scanning calorimetry (DSC), while maintaining the dimensions of the stretched film, and
   wherein the biaxially oriented and heat-set polyester film undergoes not more than 3% shrinkage when immersed for 10 seconds in a solder bath preheated to 260° C. and exhibits a coefficient of thermal expansion value of 10–85 ppm/° C. when measured between 120 and 150° C., and a coefficient of thermal expansion value of 10–42 ppm/° C. when measured between 25 and 90° C.

6. The thermoplastic article of claim 5 wherein said at least one laminate comprises in order:
  I. a copper layer;
  II. said thermally curable adhesive; and
  III. said biaxially oriented and heat-set polyester film.

7. The thermoplastic article of claim 6 wherein the copper layer has a thickness of 17 to 140 microns; and the polyester has a melting point of at least 270° C. and an inherent viscosity of 0.4 to 1.2 as measured at 25° C. using 0.50 gram of polymer per 100 mL of a solvent composed of 60 weight percent phenol and 40 weight percent tetrachloroethane according to ASTM method D2857-95, and comprises:
  (1) diacid residues comprising at least 97 mole percent of terephthalic acid residues, naphthalenedicarboylic acid residues or combinations thereof; and
  (2) diol residues comprising at least 97 mole percent of 1,4-cyclohexanedimethanol residues.

8. A flexible electronic circuit board comprising at least one biaxially oriented polyester film produced from a polyester comprising:
  (1) diacid residues comprising at least 90 mole percent of terephthalic acid residues, naphthalenedicarboylic acid residues or combinations thereof; and
  (2) diol residues comprising at least 90 mole percent of 1,4-cyclohexanedimethanol residues,
    wherein the polyester film is stretched at a ratio of about 2.5× to 3× in the machine direction (MD) and about 2.5× to 3× in the transverse direction (TD) at stretching temperatures between 90 and 110° C.,
    wherein the stretched film is heat-set at an actual film temperature of from 260° C. to Tm, wherein Tm is the melting point of the polyester as measured by differential scanning calorimetry (DSC), while maintaining the dimensions of the stretched film, and
    wherein the biaxially oriented and heat-set polyester film undergoes not more than 3% shrinkage when immersed for 10 seconds in a solder bath preheated to 260° C. and exhibits a coefficient of thermal expansion value of 10–85 ppm/° C. when measured between 120 and 150° C., and a coefficient of thermal expansion value of 10–42 ppm/° C. when measured between 25 and 90° C.

9. The flexible electronic circuit board of claim 8 wherein said polyester has a melting point of at least 270° C. and an inherent viscosity of 0.4 to 1.2 as measured at 25° using 0.50 gram of polymer per 100 mL of a solvent composed of 60 weight percent phenol and 40 weight percent tetrachloroethane according to ASTM method D2857-95, and comprises:
  (1) diacid residues comprising at least 97 mole percent of terephthalic acid residues, naphthalenedicarboylic acid residues or combinations thereof; and
  (2) diol residues comprising at least 97 mole percent of 1,4-cyclohexanedimethanol residues.

10. The flexible electronic circuit board of claim 8 comprising one or more laminates, wherein at least one of said laminates comprises in order:
  I. a copper layer;
  II. a thermally curable adhesive; and
  III. said biaxially oriented and heat-set polyester film.

\* \* \* \* \*